United States Patent [19]

Nair

[11] Patent Number: 4,820,661
[45] Date of Patent: Apr. 11, 1989

[54] GLASS CERAMIC DIELECTRIC COMPOSITIONS

[75] Inventor: Kumaran M. Nair, East Amherst, N.Y.

[73] Assignee: E. I. Du Pont de Nemours and Company, Wilmington, Del.

[21] Appl. No.: 205,002

[22] Filed: Jun. 3, 1988

Related U.S. Application Data

[63] Continuation of Ser. No. 885,827, Jul. 15, 1986, abandoned.

[51] Int. Cl.$^4$ .................... C03C 3/006; C03C 10/06
[52] U.S. Cl. .................................... 501/79; 501/8
[58] Field of Search .................. 501/8, 15, 17, 20, 79

[56] References Cited

U.S. PATENT DOCUMENTS

| | | | |
|---|---|---|---|
| 3,578,470 | 11/1968 | Bahat et al. | 501/8 |
| 3,586,522 | 6/1971 | Hoffman | 501/8 |
| 3,649,353 | 3/1972 | Ulrich | 117/212 |
| 3,656,984 | 4/1972 | Hoffman | 106/53 |
| 3,787,219 | 1/1974 | Amin | 106/73.3 |
| 3,848,079 | 11/1974 | Amin | 174/68.5 |
| 4,358,541 | 11/1982 | Andrus et al. | 501/8 |
| 4,392,180 | 7/1983 | Nair | 361/321 |

FOREIGN PATENT DOCUMENTS 233995 3/1986 German Democratic Rep. .

*Primary Examiner*—Ferris H. Lander

[57] ABSTRACT

The invention is directed to thick film crossover dielectric compositions in which the dielectric is an amorphous aluminoborosilicate glass which upon firing forms a single phase of celsian in a matrix of amorphous remainder glass.

2 Claims, No Drawings

GLASS CERAMIC DIELECTRIC COMPOSITIONS

This application is a continuation of Ser. No. 885,827, filed July 15, 1986, now abandoned.

FIELD OF THE INVENTION

The invention relates to glass ceramic dielectric compositions and particularly to such compositions for use as crossover dielectrics.

BACKGROUND OF THE INVENTION

In the manufacture of complex electronic multilayer structures, it is frequently necessary to pass conductor lines over each other. In these instances the crossing conductive lines must be insulated from each other to prevent short circuiting. In addition, it is necessary to separate the conductor lines in such manner as to prevent "cross-talk" between the conductive lines, i.e., the accumulation of energy from one layer and the discharge of that energy to the other layer.

It is recognized that dielectric materials situated between opposing conductor layers tend to act as capacitors in the sense that they accumulate electrical charges and then discharge them when a certain charge level is reached. In addition, conductive species such as silver ions, which may be present in the compositions, migrate through the dielectric in the direction of opposite polarity when the circuit is charged or in operation. The tendency of a given dielectric material to allow migration of the conductive species is related to the number of micropaths within the dielectric material which facilitate the movement of ionic charges and which allow ionic migration under DC bias. Thus, to improve the reliability of circuit systems, it would be ideal to have a low capacitance (low k) dielectric material which is so non-porous that it contains virtually no micropaths.

Conventional oxide ceramic systems such as $Al_2O_3$ and $SiO_2$ are not suitable in this regard because they do not sinter at thick film processing conditions and therefore do not densify and form a sufficiently non-porous dielectric film. On the other hand, simple glass systems which readily form an extremely non-porous dielectric glassy film during thick film processing excessively soften during the firing of subsequent layers and thus allow the adjoining conductor to diffuse into the dielectric layer.

In pursuit of the elusive solution of the problem, it has been proposed to use crystallizable glasses as the dielectric material. For example, U.S. Pat. No. 3,656,984 to Hoffman discloses the use of glasses which form Ba/Al feldspar crystals upon firing. However, these glasses were unsatisfactory for many applications because of their very low temperature coefficient of capacitance (TCC) and high incidence of circuit failures under humid conditions. Furthermore, Amin in U.S. Pat. No. 3,787,219 discloses the use of an admixture of $CaTiO_3$ with a lead-free glass which forms at least three crystal phases upon firing. While these latter materials had better TCC values and were quite satisfactory for many applications, they have been found to be insufficiently reliable under very humid conditions. Thus, there remains a substantial unmet need for dielectric materials having little or no ionizable species under humid conditions, which sinter to a dense microstructure and thus by having fewer micropaths to negate ionic migrations and thereby improve the reliability of the circuits in which they are used.

SUMMARY OF THE INVENTION

The invention is, therefore, directed in a first aspect to a printable thick film dielectric composition consisting essentially of (a) finely divided particles of an amorphous aluminoborosilicate glass which is crystallizable at thick film processing conditions to form a single phase of celsian crystals in a matrix of amorphous remainder glass dispersed in (b) organic medium.

A second aspect of the invention is directed to amorphous aluminoborosilicate glass frit compositions which are crystallizable at thick film processing conditions to form a single phase of celsian crystals in a matrix of remainder glass.

DEFINITIONS

Thick Film Processing Conditions

As used herein, the captioned terms refers to a firing cycle of approximately 60 min., of which 10 min. is at a peak temperature of 800°–950° C.

Remainder Glass.

When the glasses of the invention are heated under thick film process conditions, a single crystal phase is formed out of the parent glass. The thusly formed crystals are dispersed in a matrix of the parent glass which has been changed in composition by the formation of the crystals therefrom. This glass, which remains after crystal formation and which serves as a matrix for the formed ceramic crystals, is referred to herein as "remainder glass".

PRIOR ART

U.S. Pat. No. 3,787,219 Amin

The reference is directed to a printable dielectric composition consisting of 1–40% wt. $CaTiO_3$ and 99–60% wt. of a lead-free crystallizable glass frit. Upon firing, one major crystalline phase is formed from the glass - celsian ($BaAl_2Si_2O_8$) - and two minor phases are formed - sphene ($CaTiSiO_5$) and zinc orthosilicate [$(ZnO)_2SiO_2$].

U.S. Pat. No. 3,649,353 Ulrich

The reference is directed to a dielectric thick film composition consisting of 10–90% wt. $BaTiO_3$ and a crystallizable lead-free $BaTiO_3$ glass frit. Upon firing at 700°–1300° C., two crystalline phases are formed. The frit composition by weight is 54.7% BaO, 24.0% $TiO_2$, 3.2% $BaF_2$, 7.9% $Al_2O_3$, 2.0% $GeO_2$ and 8.2% $SiO_2$.

U.S. Pat. No. 4,392,180 Nair

The Nair patent is directed to thick film dielectric compositions comprising substituted perovskite inorganic dopant and a low temperature devitrifiable frit. The frit is disclosed generally to include glasses which yield a single crystalline phase having the same composition as the parent glass or which yield multiple crystalline phases having different compositions than the parent glass.

DETAILED DESCRIPTION OF THE INVENTION

Glass Frit

The glasses suitable for use in the invention are amorphous aluminoborosilicates which, upon being subjected to thick film process conditions as defined above, form a single crystalline ceramic phase of $BaAl_2Si_2O_8$ (celsian). No other crystalline phases are formed in detectable quantities.

Preferred compositions are given in Table 1.

TABLE 1

Preferred Amorphous Glass Frit Compositions

| Composition | Glass Designation A | B |
|---|---|---|
| | % wt. | |
| $SiO_2$ | 30 | 30 |
| $TiO_2$ | 8 | 8 |
| $Al_2O_3$ | 10 | 10 |
| BaO | 26 | 10 |
| ZnO | 10 | 10 |
| CaO | 6 | 24 |
| $B_2O_3$ | 8 | 8 |
| MgO | 2 | — |

It is essential that the amorphous glass frit contain either $TiO_2$ or $ZrO_2$, either or both of which serve as a nucleating agent for the formation of the celsian crystals during the thick film firing process.

Though mixtures of the nucleating agents can be used, the total amount must be at least 8% wt. in order to control the crystallization which takes place during standard thick film firing conditions. Higher concentrations of nucleating agents, though unnecessary, are not usually detrimental depending on the paste processing conditions.

The glasses are prepared by conventional glass-making techniques, i.e., by mixing the desired components in the desired proportions and heating the mixture to form a melt. As is well known in the art, heating is conducted to a peak temperature and for a time such that the melt becomes entirely liquid and homogeneous. In preparing the compositions of the invention, the components are premixed by shaking in a polyethylene jar with plastic balls and then melted in a platinum or ceramic container at about 1500° C. The melt is heated at the peak temperature for a period of at least one hour. Heating for less than one hour would result in inhomogeniety in the glass. A heating time of 1.5–2 hours is preferred. The melt is then poured into cold water. The maximum temperature of the water during quenching is kept below 120° F. by increasing the volumetric ratio of water to melt. The crude frit after separation from water is freed of residual water by drying in air or by displacing the water with methanol. The crude frit in slurry form is then ball-milled for 20–24 hrs. in alumina containers using alumina balls. Alumina picked up by the materials, if any, is not within observable limits as measured by X-ray diffractional analysis.

After discharging the milled frit slurry from the mill, excess solvent is removed by decantation and the frit powder is air dried at room temperature. The dried powder is then screened through a 325 standard mesh screen to remove any large particles.

When the glasses of the invention are heated under thick film process conditions, a single phase of celsian (as determined by X-ray diffraction) is formed out of the parent glass, crystals of which are dispersed in a matrix of the remainder glass, i.e. the glass which remains after crystallization. The remainder glass is always of different composition than the crystallized phase but may or may not have the same softening point.

Organic Medium

The dielectric compositions described above will ordinarily be formed into paste which is capable of being printed in any desired circuit pattern. In its simplest aspects, such pastes are made merely by dispersing the dielectric powder mixture into an appropriate organic medium (vehicle).

Any inert liquid can be used as the vehicle. Water or any one of various organic liquids, with or without thickening agents, stabilizing agents and/or other common additives, can be used as the vehicle. Exemplary of the organic liquids which can be used are aliphatic alcohols, esters of such alcohols such as the acetates and propionates, terpenes such as pine oil, terpineol and the like, solutions of resins such as the polymethacrylates of lower alcohols, or solutions of ethyl cellulose in solvents such as pine oil and monobutyl ether of ethylene glycol monoacetate. The vehicle can also contain volatile liquids to promote fast setting after printing to the substrate.

A preferred vehicle is based on ethyl cellulose and β-terpineol in a weight ratio of about 1:8. The pastes are conveniently prepared on a three-roll mill. A preferred viscosity for these compositions is approximately 100–200 Pa.s, measured on a Brookfield HBT viscometer using a #5 spindle at 10 rpm. The amount of vehicle utilized is determined by the final desired formulation viscosity.

Test Procedures

Capacitance. Capacitance is a measure of the capability of a material to store an electric charge. Expressed mathematically, $C = KA$ divided by $t$, where A equals area overlap of the conductors, t is thickness of the dielectric layer and K is dielectric constant.

The units of capacitance are farads or fractions thereof such as microfarads, $10^{-9}$ farad, or picofards $10^{-12}$ farad.

Dissipation Factor. Dissipation Factor (DF) is a measure of the phase difference between voltage and current. In a perfect capacitor, the phase difference would be 90°. However, in practical dielectric systems, DF is less than 90° because of leakage and relaxation losses. In particular, DF is the tangent of the angle by which the current lags the 90° vector.

Insulation Resistance. Insulation resistance (IR) is a measure of the ability of a charge capacitor to withstand leakage in DC current. Insulation resistance is a constant for any given dielectric regardless of capacitance.

To perform the IR test under hot conditions, which is a measure of reliability, the test voltage was increased to 200v, the test capacitor was heated to 125° C. and the time of testing was extended to 64 hrs. The test itself measures "RC Product", which is the product of IR times Capacitance. The IR is then calculated from the RC product by dividing into it the previously measured value of Capacitance. Under these conditions, the IR is determined periodically during the aging process. An IR value of $1 \times 10^9$ ohms is considered to be satisfactory and IR values less than $1 \times 10^9$ ohms are considered to be failures.

Breakdown Voltage. The Breakdown Voltage test (also called the dielectric-strength test) consists of the application of a voltage higher than rated voltage for a specific time between mutually insulated portions of a component part or between insulated portions and ground. The voltage is raised until the system fails which is indicated by short circuiting. This is used to observe whether the component part can operate safely at its rated voltage and withstand momentary overpotentials due to switching, surges, and other similar phenomena. Although this test is often called a voltage breakdown or dielectric-strength test, it is not intended that this test cause insulation breakdown or that it be used for detecting corona. Rather it serves to determine whether insulating materials and spacings in the component part are adequate. When a component part is faulty in these respects, applicatin of the test voltage will result in either disruptive discharge or deterioration. Disruptive discharge is evidenced by flashover (surface discharge), sparkover (air discharge), or breakdown (puncture discharge). Deterioration due to excessive leakage currents may change electrical parameters or physical characteristics. Dielectric breakdown is reported in volts/mil or volts/cm of dielectric thickness. Dielectric layers are designed to have sufficient thickness to provide a margin of safety well below the breakdown of the electric. The test is conducted in accordance with MIL-STD-202E, Apr. 16, 1973.

Leakage Current. The Leakage Current test is a measure of the level of hermeticity of a fired dielectric film as measured by a D.C. voltage-driven electrolytic current when the dielectric is immersed in a saline solution.

Test specimens are prepared by printing a thick film conducting pattern on twelve 2"×2"Al$_2$O$_3$ substrates. The conductor patterns are oven dried at 110°–120° C. and then fired at 850° C. Two layers of patterned dielectric materials are then applied sequentially on top of the fired conductor. Each of the layers is oven-dried at 150° C. and fired at 850° C. Thickness of the combined dielectric layers is 30–50 μm.

These test prints are placed in a prewired connector and positioned in a 1.0N NaCl solution so that the test print is completely immersed. Using a platinum anode, 10 volts are applied between the conductor assembly and anode and the current for each of 10 test samples is measured after 5 mins. under voltage. A leakage current of 50 μA/cm$^2$ or less is considered satisfactory.

High Humidity Bias Time Test (HHBT). In this test, the percentage of part failures due to insufficient IR is measured after the part has been subjected to an environment of 85% relative humidity, 85° C. and a stress of 5VDC for 1,000 hrs. After 1,000 hrs. of these conditions, 100VDC is applied across the terminal and the IR of the part is measured periodically as described above. Insulation resistance of $1\times10^9$ ohms/100VDC is considered satisfactory. Below $1'10^9$ ohms/100 VDC is considered a failure.

High Bias Time Test (HBT). In this test, the percentage of part failures due to insufficient IR is measured periodically after the part has been subjected to an environment of 150° C. and 200VDC for a period of at least 1,000 hrs. After 1,000 hrs. at these conditions, 100VDC is applied across the terminal and the IR of the part is measured as described above. Pass/fail criteria are the same as for the HHBT test described above.

FORMULATION

The glass-ceramic compositions of the invention will ordinarily be formulated into a paste which is capable of being printed in any desired circuit pattern. Such pastes are made by dispersing the anhydrous glass frit into an appropriate organic medium as described herein above.

EXAMPLES

Examples 1 and 2

Two 5 kg samples of frits A and B were prepared in the same manner as described above. Two 100 g thick film pastes were prepared from the glasses and were prepared for testing as to fired thickness, dielectric constant (K) DF, IR and Breakdown Voltage. In each case, the frit paste was applied to each of three different commercially available conductor thick film layers. The dielectric paste was then screen printed over each of the fired conductors and fired under Thick Film Processing Conditions. After firing the dielectric layer, a patterned layer of the same conductor is screen printed atop the dielectric layer and fired. The composition of the glasses is given in Table 1 above and the test properties are given in Table 2 below.

TABLE 2

Electrical Properties of Glass-Ceramic Dielectric Thick Films

| | Example No. | |
|---|---|---|
| | 1 | 2 |
| | Glass Designation | |
| Thick Film Properties | A | B |
| Film Thickness, μm | | |
| Pd/Ag | 42 | 41 |
| Ag | 39 | 42 |
| Au | 27 | 36 |
| Capacitance (K) | | |
| Pd/Ag | 8.8 | 11.5 |
| Ag | 9.3 | 12.6 |
| Au | 6.4 | 13.1 |
| Dissipation Factor, % | | |
| Pd/Ag | 0.1 | 0.2 |
| Ag | 0.0 | 0.0 |
| Au | 0.0 | 0.1 |
| Insulation Resistance $1 \times 10^{13}$ Ω/100 VDC | | |
| Pd/Ag | 17 | 11 |
| Ag | 13 | 8 |
| Au | 13 | 6 |
| Breakdown Voltage, VDC/mil | | |
| Pd/Ag | 970 | 478 |
| Ag | 1355 | 845 |
| Au | 2107 | 728 |

The electrical properties of both glasses were satisfactory in all instances Both glasses were amorphous (noncrystalline) before firing but when they were examined by x-ray diffraction after firing, they were found to contain a single dispersed phase of celsian crystals in the remainder glass. In the case of frit A, the softening point of the remainder glass was 610° C. as compared to 615° C. for the parent frit. This is not a significant difference. In the case of frit B, the softening point of both the parent and the remainder frit was 625° C.

Examples 3–7

In these examples a series of frits having the composition of glass A was prepared in various batch sizes and under various differing circumstances to observe lot-to-lot variations. The manufacturing history and differences among the five samples is given in Table 3 below.

TABLE 3

| Glass A Lot Variations | |
|---|---|
| Example No. | Description |
| 3 | 3 kg batch - 1st paste |
| 4 | Example 3 frit - 2nd paste |
| 5 | Example 3 frit - 3rd paste |
| 6 | 5 kg batch - 1st lot |
| 7 | 5–100 kg batches |

Fired thick films were prepared from each of the above described five frits and were tested as to K, DF, IR, Breakdown Voltage and Leakage Current. The results of these tests are given in Table 4 below:

TABLE 4

Lot-to-Lot Variations in Electric Properties of Glass Ceramic Dielectrics

| Thick Film Properties | Example No. | | | | |
|---|---|---|---|---|---|
| | 3 | 4 | 5 | 6 | 7 |
| K | 9.7 | 8.9 | 8.7 | 10.6 | 10.7 |
| DF, % | 0.1 | 0.1 | 0.1 | 0.0 | 0.1 |
| IR, Ω/100 VDC | $>1 \times 10^{13}$ | $>1 \times 10^{13}$ | $>1 \times 10^{13}$ | $>1 \times 10^{13}$ | $>1 \times 10^{13}$ |
| Breakdown Voltage VDC/mil | >1000 | >900 | >800 | >1000 | >1000 |
| Leakage Current, microamps/cm$^2$ | 8.7 | 4.0 | 1.8 | 10 | 10 |
| HHBT, % failure | None | None | None | — | — |
| HBT, % Failure | None | None | None | — | — |
| Hot IR, % failure | None | None | None | None | None |

The data in the preceding examples all show that the electrical properties of the glass-ceramic dielectric layers made in accordance with the invention had excellent reliability even under very severe conditions of use.

I claim:

1. An amorphous aluminoborosilicate glass frit which is crystallizable at thick film processing conditions to form a single phase of celsian in a matrix of remainder glass the amorphous glass consisting essentially by weight of 30% SiO$_2$, 8% TiO$_2$, ZrO$_2$ or mixtures thereof, 10% Al$_2$O$_3$, 10% BaO, 10% ZnO, 24% CaO and 8% B$_2$O$_3$.

2. A printable thick film dielectric composition consisting essentially of (a) finely divided particles of an amorphous aluminoborosilicate glass which is crystallizable at Thick Film Processing Conditions to form a single phase of celsian in a matrix of remainder glass dispersed in (b) organic medium, the glass consisting essentially by weight of 30%, SiO$_2$, 8% TiO$_2$, ZrO$_2$ or mixtures thereof, 10% Al$_2$O$_3$, 10% BaO, 10% ZnO, 24% CaO and 8% B$_2$O$_3$.

* * * * *